United States Patent [19]

Sasaki et al.

[11] Patent Number: 4,761,219
[45] Date of Patent: Aug. 2, 1988

[54] MAGNETRON SPUTTERING ETCHING APPARATUS

[75] Inventors: Naoto Sasaki; Fumihiko Sato, both of Fuchu, Japan

[73] Assignee: Anelva Corporation, Tokyo, Japan

[21] Appl. No.: 71,240

[22] Filed: Jul. 9, 1987

[30] Foreign Application Priority Data

Jan. 23, 1987 [JP] Japan ................................. 62-13887

[51] Int. Cl.[4] ............................................. C23C 14/34
[52] U.S. Cl. ................................ 204/298; 204/192.1; 204/192.32; 156/345
[58] Field of Search ................ 204/192.1, 192.12, 298, 204/164, 192.32; 156/345

[56] References Cited

U.S. PATENT DOCUMENTS

| | | | |
|---|---|---|---|
| 4,492,610 | 1/1985 | Okano et al. | 204/298 X |
| 4,498,969 | 2/1985 | Ramachandran | 204/298 |
| 4,552,639 | 11/1985 | Garrett | 204/298 |
| 4,557,819 | 12/1985 | Megcham et al. | 204/298 |
| 4,631,106 | 12/1986 | Nakazato et al. | 204/298 X |
| 4,657,619 | 4/1987 | O'Donnell | 204/298 X |

FOREIGN PATENT DOCUMENTS 2707144  8/1977  Fed. Rep. of Germany ...... 204/298

OTHER PUBLICATIONS

M. Sekine, "Silicon Trench Etching Using $10^{-3}$ Torr Magnetron Discharge Reactive Ion Etching", Proceedings of Symposium on Dry Process, Nov. 17-18, 1986, Tokyo, pp. 42-47.

T. Arikado, "Al Tapered Etching Technology Using $10^{-3}$ Torr Magnetron Discharge Reactive Ion Etching", Proceedings of Symposium on Dry Process, Nov. 17-18, 1986, Tokyo, pp. 48-52.

Primary Examiner—John F. Niebling
Assistant Examiner—Nam X. Nguyen
Attorney, Agent, or Firm—Pollock, VandeSande & Priddy

[57] ABSTRACT

A magnetron sputtering etching apparatus includes a pair of electrodes opposed to each other in a vacuum vessel and a radio-frequency power source applying radio-frequency power to the opposed electrodes. Magnetic lines of force, whose components are in parallel with electric lines of force of the radio-frequency power, are set to reach the surface of a substrate to be processed between the electrodes. Magnets are arranged on rear sides of the pair of electrodes, respectively, so that different poles of the magnets are in opposition to each other. At least one of the magnets is rotated about an axis substantially in parallel with the electric lines of force. With this arrangement, charged particles in plasma are spirally rotated with the aid of the magnetic lines of force and the plasma concentrates at locations where magnetic fluxes concentrate thereby accelerating the etching of the substrate. As the magnet is rotated relative to the substrate, the magnetic fluxes move all over the substrate, so that the plasma uniformly attacks the substrate for uniformly etching the surface of the substrate.

3 Claims, 1 Drawing Sheet

U.S. Patent  Aug. 2, 1988  4,761,219
FIG_1
PRIOR ART
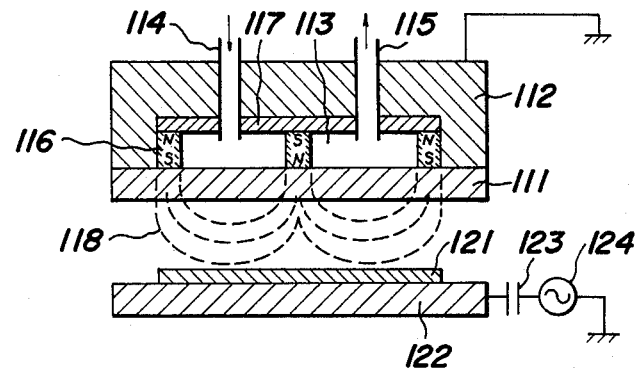
FIG_2
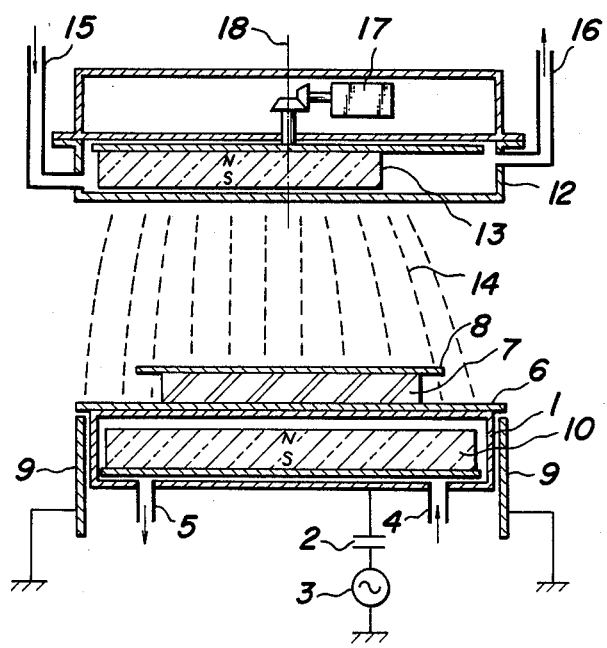

MAGNETRON SPUTTERING ETCHING APPARATUS

BACKGROUND OF THE INVENTION

This invention relates particularly to an improvement in magnetron sputtering etching apparatus suitable for cleaning substrate surfaces or other treatments as a pretreatment prior to deposition of films on the substrate surfaces.

Among conventional etching methods, radio-frequency two electrode etching method using flon gas (fluorocarbon gas) is most typical. With this method, films of silicon, aluminium, or the like can be etched with very fine widths of the order of submicrons. This method has greatly contributed to the development of large scale integrated circuits. However, as this etching method tends to contaminate the substrate surfaces, it is not suitable for cleaning processing of substrate surfaces.

Different from the above method, there has been a radio-frequency two electrode sputtering etching method using argon, which has been conveniently used, because there is no risk of substrate surfaces being contaminated. This method is used for removing contaminated layers to clean semiconductor substrate surfaces by sputtering etching the substrate surfaces in order to bring aluminium wiring layers into direct contact with the substrate surfaces, or for cleaning surfaces of lower wiring layers by sputtering etching their surfaces in order to form upper wiring layers on the lower wiring layers in multilayer wiring process.

In this argon sputtering etching of the prior art, however, the acceleration of charged particles is too high and the temperature of the substrates rises too high, sometimes to several hundred degrees (°C.). These parameters would adversely affect the substrate. In this method, moreover, another advantage is that the etching speed is low.

In order to avoid this problem, recently a magnetron sputtering etching apparatus has been widely used, wherein a magnetic field perpendicularly intersecting an electric field directed to a target is produced in the proximity of a surface of the target to enable the etching to proceed at high speeds. FIG. 1 illustrates such an apparatus of the prior art, particularly its electrodes in a schematic front sectional view.

The apparatus shown in FIG. 1 is one example of the electrode arrangement having a lower electrode on which a substrate to be processed is arranged and an upper electrode which serves also as a target to carry out etching and depositing. The upper opposed electrode includes a ground flat target 111 and an electrode body 112 having a recess to form inner cavities 113 therebetween into which cooling water is introduced through cooling water conduits 114 and 115 to cool the target 111, whose temperature is likely to be high. An iron core 117 equipped with magnets 116 is arranged on a rear surface of the target 111 on the side of the electrode body to generate a closed magnetic field 118 in the proximity of opposite surfaces of the two electrodes.

On the other hand, the lower etching electrode includes the substrate 121, a substrate holder 122 and a radio frequency power source 124 connected through a capacitor 123 to the substrate holder 122 and is arranged immediately below the upper opposed electrode.

With this etching apparatus having the electrode arrangements, its etching speed is quite high with the aid of its magnetron system. However, the etching on the surface of the substrate 121 has a distribution corresponding to the configuration of the magnetic field. Therefore, etching on the surface are not uniform so that there are excessively etched and insufficiently etched portions on the surface which would cause local inconductivity in semiconductor circuits.

SUMMARY OF THE INVENTION

It is a principal object of the invention to provide an improved magnetron sputtering etching apparatus which eliminates all the disadvantages of the prior art and provides uniform etching speed on surfaces of substrates to be processed so as to contribute to improvement of reliability of surface cleaning process.

In order to achieve this object, according to the invention, in a magnetron sputtering etching apparatus including a pair of electrodes opposed to each other in a vacuum vessel and a radio-frequency power source applying radio-frequency power to the opposed electrodes for etching a surface of a substrate to be processed positioned between the electrodes by setting magnetic lines of force whose components are substantially in parallel with electric lines of force of the radio-frequency power, magnets are arranged on rear sides of the pair of electrodes, respectively, with different poles being in opposition to each other, and at least one of said magnets is rotated about an axis substantially in parallel with said electric lines of force.

In a preferred embodiment, the axis about which the magnet is rotated is eccentric to the magnet.

With the above arrangement of the apparatus, as a magnetic field is produced substantially in parallel with the electric lines of force directing toward the electrode on the side of the substrate to be processed, charged particles in plasma are spirally rotated with the aid of the magnetic lines of force, the plasma concentrates at locations above the electrode where magnetic fluxes concentrate to accelerate the etching of the substrate to be processed on the electrode. As at least one magnet is rotated relative to the substrate to be processed, the magnetic fluxes move all over the substrate if the position of the rotating axis is suitably selected, so that the plasma uniformly attacks the substrate for uniformly etching the surface of the substrate. Moreover, as discharge impedance becomes low, acceleration voltage of the charged particles becomes low so that damage to the processed substrate is little, if any.

In order that the invention may be more clearly understood, preferred embodiments will be described, by way of example, with reference to the accompanying drawings.

BRIEF DESCRIPTION OF THE DRAWINGS

FIG. 1 is a schematic sectional view of a magnetron sputtering etching apparatus of the prior art; and FIG. 2 is a schematic sectional view illustrating one embodiment of a magnetron sputtering etching apparatus according to the invention.

DESCRIPTION OF THE PREFERRED EMBODIMENT

FIG. 2 schematically illustrates in schematic sectional view an electrode portion of a magnetron sputtering etching apparatus as one embodiment of the invention.

An etching electrode 1 is connected through a capacitor 2 to a radio-frequency power source 3 and is provided with a cooling water inlet 4 and a cooling water outlet 5 to circulate cooling water in a closed chamber in the etching electrode 1 so as to prevent overheating of the electrode. A permanent magnet 10 is fixed in the closed chamber. A substrate 8 to be processed is supported by the etching electrode 1 through a quartz shield plate 6 and a substrate base 7 made of quartz. Reference numeral 9 denotes shield plates.

An opposed electrode 12 in opposition to the etching electrode 1 comprises a cooling water inlet 15 and a cooling water outlet 16 to circulate cooling water through a closed chamber in the electrode 12 so as to prevent overheating of the electrode. A permanent magnet 13 is provided in the closed chamber so as to be rotatively driven about an axis 18 by a motor 17 and arranged with their magnetic poles in opposition to opposite magnetic poles of the permanent magnet 10.

As above described, the permanent magnets 10 and 13 in the closed chambers on the rear sides of the etching and opposed electrodes 1 and 12 are arranged with their different poles in opposition to each other to generate the magnetic field 14. Charged particles are so restrained by magnetic lines of force from magnetic field 14 to be spirally moved. Therefore, plasma concentrates at locations on the substrate where the magnetic lines of force concentrate to accelerate the etching speeds at the locations.

When the motor 17 in the opposed electrode 12 is energized to eccentrically rotatively drive the permanent magnet 13 about the rotating axis 18, the locations on the substrate where the plasma concentrates are also rotatively moved, so that meanwhile the substrate is uniformly subjected to the plasma and the etched amount becomes uniform on the substrate surface.

In this case, as discharge impedance becomes low, acceleration voltage of the charged particles becomes low so that damage to the processed substrate is little, if any.

In an actual etching with the magnetron sputtering etching apparatus according to the invention, the etching was carried out with argon gas pressure of $1 \times 10^{-3}$ Torrs. The etching speed was more than five times that of the apparatus of the prior art devoid of the magnets.

The distribution of etched amount on a substrate was sufficiently uniform to achieve effective cleaning.

Moreover, although the permanent magnet 13 on the rear side of the opposed electrode 12 is eccentrically rotated in the above embodiment, the same effect can be accomplished by eccentrically rotating the permanent magnet 10 on the rear side of the etching electrode 1; or both of the permanent magnets 10 and 13 may be rotated simultaneously.

As can be seen from the above explanation, the present invention provides an improved magnetron sputtering etching apparatus capable of performing uniform etching on surfaces of substrates to be processed at high speed with less chance of damage to the substrates.

It is further understood by those skilled in the art that the foregoing description is that of preferred embodiment of the disclosed apparatus and that various changes and modifications may be made in the invention without departing from the spirit and scope thereof.

What is claimed is:

1. A magnetron sputtering etching apparatus comprising:
    a pair of electrodes opposed to each other in a vacuum vessel;
    a radio-frequency power source applying radio-frequency power to the opposed electrodes for etching a surface of a to be processed substrate positioned between the electrodes by setting magnetic lines of force whose components are substantially in parallel with electric lines of force of the radio-frequency power; and
    magnets arranged on rear sides of the pair of electrodes, respectively, with different poles being in opposition to each other, and at least one of the magnets rotating about an axis substantially in parallel with the electric lines of force.

2. A magnetron sputtering etching apparatus as set forth in claim 1, wherein said axis about which said magnet is rotated is eccentric to the magnet.

3. A magnetron sputtering etching apparatus as set forth in claim 1, wherein said substrate is arranged on a side of the electrode on a side of said radio-frequency power source, and the magnet is eccentrically rotated.

* * * * *

UNITED STATES PATENT AND TRADEMARK OFFICE
CERTIFICATE OF CORRECTION

PATENT NO. : 4,761,219

DATED : August 2, 1988

INVENTOR(S) : Naoto Sasaki, et al.

It is certified that error appears in the above-identified patent and that said Letters Patent is hereby corrected as shown below:

Column 1, line 38, change "advantage" to --disadvantage--.

Column 2, line 4, change "are" to --is--.

Column 2, line 65, after "view" insert --of--.

Signed and Sealed this

Sixth Day of December, 1988

Attest:

DONALD J. QUIGG

Attesting Officer

Commissioner of Patents and Trademarks